United States Patent [19]
Fröhlich

[11] 4,318,222
[45] Mar. 9, 1982

[54] APPARATUS FOR SEQUENTIALLY ASSEMBLING COMPONENTS

[76] Inventor: Hans-Jürgen Fröhlich, Almstrasse 16, D - 7601 Durbach, Baden, Fed. Rep. of Germany

[21] Appl. No.: 877

[22] Filed: Jan. 4, 1979

[30] Foreign Application Priority Data

Jan. 11, 1978 [DE] Fed. Rep. of Germany ....... 2801093
Dec. 4, 1978 [DE] Fed. Rep. of Germany ....... 2852417

[51] Int. Cl.[3] ............ H05K 13/04
[52] U.S. Cl. ............ 29/721; 29/741; 340/286 M; 340/332; 340/380
[58] Field of Search ............ 340/332, 380, 381, 780, 340/811, 286 M; 29/720, 721, 701, 741, 739, 407, 832, 833; 364/491

[56] References Cited

U.S. PATENT DOCUMENTS

| | | | |
|---|---|---|---|
| 3,564,692 | 2/1971 | Knoll et al. | 29/720 |
| 3,623,066 | 11/1971 | Norris | 29/720 |
| 3,760,484 | 9/1973 | Kowalski | 29/720 |
| 3,852,865 | 12/1974 | Ragard | 29/720 |

FOREIGN PATENT DOCUMENTS

| | | |
|---|---|---|
| 2256592 | 10/1975 | Fed. Rep. of Germany . |
| 556130 | 11/1974 | Switzerland . |
| 1482198 | 8/1977 | United Kingdom . |

*Primary Examiner*—James J. Groody
*Attorney, Agent, or Firm*—Armstrong, Nikaido, Marmelstein & Kubovcik

[57] ABSTRACT

An apparatus for assembling parts in a specified order to steps into a desired device where the parts are located in a plurality of material supply positions comprising a fixed base plate having a plurality of openings transparent to light therein, a plurality of assembly positions, an adapter plate positioned parallel to the base plate having a plurality of openings therein congruent with the openings in the base plate, a light source movably attached to the base plate for selectively shining through the openings in the base plate and the adapter plate, glass fiber optics for transmitting light from the light source to the assembly positions and the material supply positions which include a plurality of fittings secured in the openings of the base plate and the adapter plate, and glass fiber optic conduits extending between the selected fittings and the assembly positions and the material supply positions, and a mechanism for sequentially moving the light source from opening to opening. The specified order of steps of assembly at the assembly positions and the appropriate material supply positions to each step are successively indicated by the light source being sequentially moved past the openings of the base plate and adapter plate shining light therethrough. The light travels through the selected portions of the glass fiber optics to the assembly positions and the material supply positions. Various details of the subassemblies of the apparatus are disclosed, as well as certain improvements in fittings for glass fiber optics.

14 Claims, 9 Drawing Figures

APPARATUS FOR SEQUENTIALLY ASSEMBLING COMPONENTS

Figure 1:
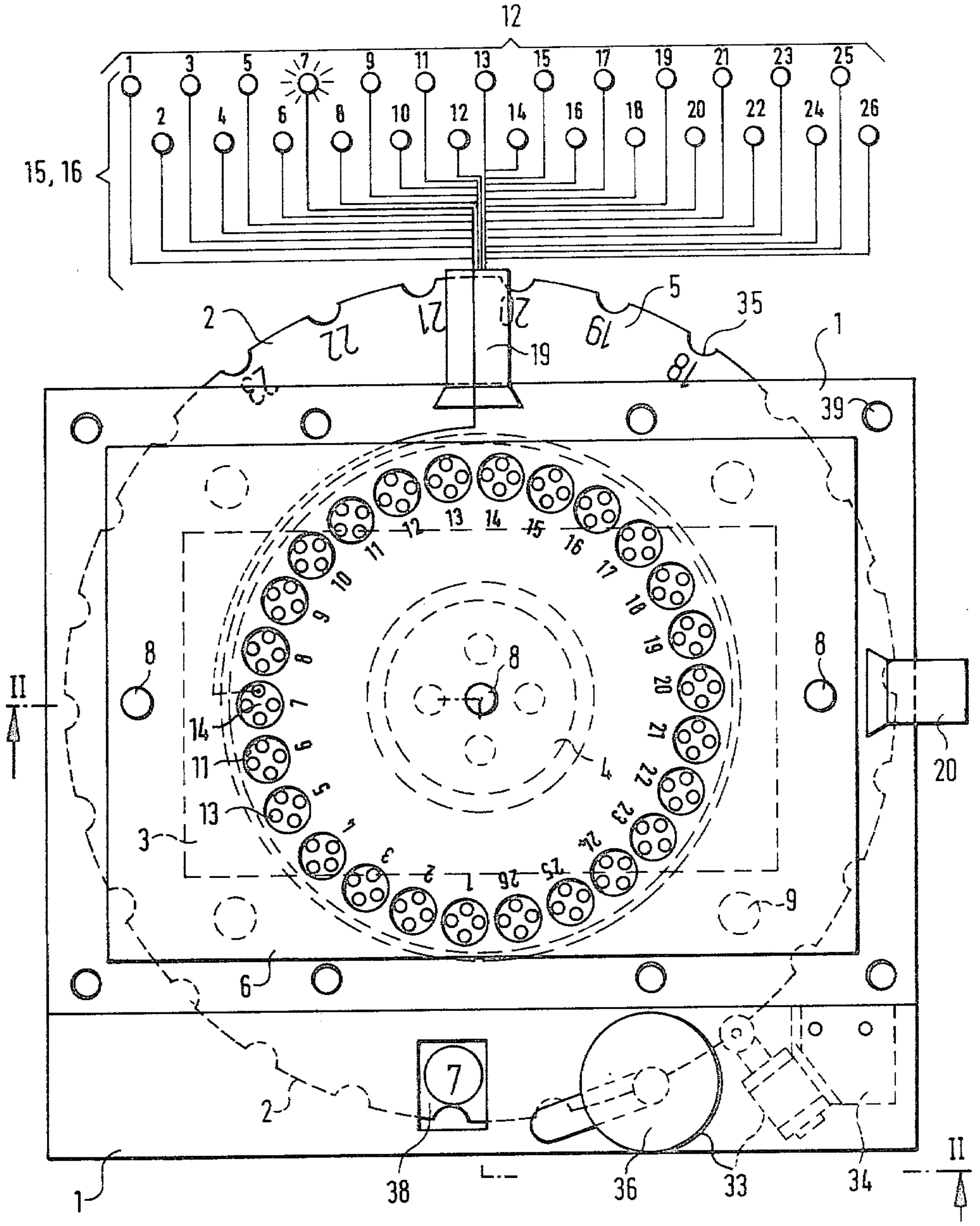

The invention relates to an apparatus for aiding the repetitive or series production of appliances consisting of different single parts through the assembly of these single parts, whereby these parts will be picked out and assembled from an assorted stock.

Each manually operated assembly work place in industry using known standard data-processing systems (e.g. MTM, WF, MTA, BMT, DTM etc.) has, according to present experiences, a number of disadvantages. These are also present where assembly sequences are established without the help of the known standard data-processing systems. For example, assembly personnel are required to commit the assembly sequences to memory. It takes an appropriate time to train someone in this, dependent, of course, on the ability of the individual to memorize a number of sequences. With the present trend of job enlargement or job enrichment, the memories of assembly personnel have to be more exacting. Defects in quality according to incorrect performance of the assembly sequence are the result of overtaxing mental tasks. A working sequence documentation or working report is imperative, at the present to control the assembly process steps. This has to be made up and filled in by the job planner, so that for quality control, a documentation is available in case of objections or change in personnel. This takes considerable administrative work.

A further disadvantage of the known systems is in case of personnel absenteeism through illness, vacation or notice when already trained personnel, the so-called swing-men, or personnel which have to be newly trained have to be put in. The operation sequence description or operation instruction detailing assembly steps then serves to overcome the training phase. Additionally, there arise, at the present, considerable indirect costs through production losses because of personnel absences which cannot be settled spontaneously. Unsatisfactory memory qualification requires a restriction in the number of operation sequences and consequently necessitates higher investments in the number of working places. Considerable procedure documentations increase administration costs, for instance, paper work. In addition, rejection costs increase because of incorrect assembly.

Prior to the development of this invention, it has been necessary to specify the procedure and apparatus as above mentioned through which the problems stated could be avoided or considerably reduced.

With the above mentioned method, the control and assembly-directing function is executed through light signals produced at the taking-out positions of the single parts stock whose sequences correspond with the sequences of assembly operations.

Especially characteristic of this procedure is that additional light signals are produced which indicate the assembly spot of the single part to be selected from stock.

It is desired to produce both kinds of light signals at the same time and to maintain them until the assembly of the single part has been completed. The fundamental idea of the invention is with the procedure as well as with the apparatus concept mentioned below, the transmission of optic signals through indexed advance in order to present the optical assembly sequences with the help of glass fiber optics, electronic gears and electronics whereby, at the same time, the assembly sequences are also shown with optic signals.

In particular, the industry workforce will be supported through this invention by striving to achieve the following goals:

By turning away from the assembly line techniques and utilizing individual complete assembly workplaces, the assembly area will become more humanized.

Defects in quality caused through human error will be minimized.

Expenditures for personnel training and working instruction in the assembly area will be reduced considerably.

The working area at the place of assembly will be more interesting through job enlargement and job enrichment without overburdening the brain work of the personnel.

Production loss from absenteeism of assembly personnel will be minimized.

Administrative costs for documentations will be decreased considerably.

Especially preferential application possibilities of the invention which can be used conveniently and universally in every area of assembly operations are the mass production or repetitive small-lot production.

As it has already been shown, the invention offers two possibilities to preset the assembly sequences. With sitting or standing work at a constant working place where mostly smaller units are to be assembled, part selection and stepwise assembly instructions can be given simultaneously by optic signals. it does not matter whether they are operated simultaneously or not. If an assembly operation has to be executed on a bigger assembly unit, the assembly sequence can, unless executed on a fixture, be preset through parts selection instructions. Here too, the advantages over known conventional solutions are considerable.

Another function of the invention, as mentioned above, serves to execute the operation which must be distinguished from a light source with fittings designed to produce and transmit defined light signals which be produced through a control according to the assembly and/or selection positions.

With the usual manner to assemble parts one after another a group or a complete unit, it is necessary that the operating person is well acquainted with the assembly sequences required and has knowledge about how the parts have to be positioned. This knowledge requires an appropriate period of instruction and schooling, which likewise requires qualification and intelligence. The above mentioned apparatus avoids these requirements of brain work which, so far, were very important. Only aptitude or skill are necessary to execute assembly work, which nearly always are available. Through the transmission of optic signals by means of the appropriate apparatus, the required sequences are specified in which parts have to be assembled and from where they can be selected, and, at the same time, on which place and in which way these parts have to be assembled. The sequence is preset stepwise by the apparatus and is adaptable to the manpower so that the operator can determine by himself the assembly speed and utilize it according to his skill. The so far negative experiences with job enrichment working places (overburdening brainwork) have been overcome with this optic signaling and there can be obtained big improvements in the humanization of the working area. Incorrect assembly operation sequences caused from excessive brainwork and increased defects in quality are nearly eliminated through optic signaling. Even untrained personnel after overcoming of skill problems can very quickly execute the assembly in a direct way and in the right sequence.

An especially preferential modification according to the invention can be created if the fittings to forward the light signals are built by glass fiber optic strands or—bundles.

With an advantageous further development of the invention, the fittings to produce the light signals consist of a fixed base plate transparent to light and the light source opposite to the base plate is relatively moveable in discrete steps, whereby the number and division of light projection openings correspond to the number and division of the moving steps of the light source.

It is preferential to establish the gear on an individually developed adapter plate which is placed on the base plate and which carries terminals for the glass fiber optics according to the assembly-and/or taking-out positions required.

It is preferential to plan connections for the end caps which will be disposed in the bore holes of the adapter plate.

An especially preferential embodiment of the invention comprises an assembly fixture above the adapter plate which is designed to show light exits for the glass fiber optics of the adapter plate on the points corresponding to the actual assembly positions.

A preferential further development of the invention can be created in this way, wherein the light source opposite to the base plate is movable and the light projection openings of the base plate are borings in a circular pattern and concentric to the gyre of the light source.

In detail, the invention can be further developed wherein, the light source is located in a turnable deposited container which on its top is covered by a screen disk and wherein the division of the screen is according to the division of the borings and that a deassemblable stop is developed.

An especially simple form of execution according to the invention can be created wherein the drive of the light source can be operated manually.

Such a simple turnable apparatus can be installed at each assembly area for any component assortment, whereby by means of the light source through glass fiber optics, an optic signal will be transmitted which serves for the designation of the part being picked out for assembly and the designation of the position where this part has to be assembled. This optic designation occurs parallel at the same time and is suitable, without problems, especially at a two-dimensional level, as for instance, with the assembling of electronical parts or the laying out of wire harnesses. Furthermore, at a two-dimensional level, a standardization through grit plates can be achieved.

This especially simple application of the invention is that it can appropriately used with mass productions, assembling operations with long single assembly cycles (so that the mechanical screen time does not utilize a great portion with the frequency of repetition), screwing activity, transport intensive assembly sequences, joining—and combination activities, selection instructions, and wherein the joining activity is difficult to show (big assembly objects which do not need to be specified for operation sequences and thus no adapter plate is required) and special working places with more numerous parts.

A further development of the invention is the design of a special electromotor drive with which, in an especially preferential manner, the stop lock is electrically impulse controlled.

With this form of execution, nearly the same applies as with the especially simple mechanical control of manual operation whereby additional shorter assembling standards can be obtained owing to omission of the manual activity through transportation the choice of certain positions (e.g. fault finding wire harness). This kind of unit can be especially used for fault finding if the quality control is integrated in the working operation and assembly sequence. A further appropriate operation area is mass production.

This above described system can be automated by means of a minicomputer, so that a programmed assembly sequence can be requested from memory. With the help of a foot pedal or manually operating button the programmed assembly sequences can be requested and are consequently optically visible and can be operated accordingly. This system combined for instance with a continuous lift system, results in an optimal working-place organization in the view of job enlargement and job enrichment. The programm-controlled version of the invention finds a preferential operative area also with the already mentioned large assembly objects as here frequent variant problems exist in relation with the repetition problems by which considerable mental work is requested of the operation personnel, so that through the electronic, program-controlled sequence of the material supply signalling efforts can be reduced considerably. The unit combined with programmed control can be used very rationally if a repetition production is necessary with a comprehensive variant programme, as, for instance, small lots with many variable combinations or if assembly of equal parts on the same working place for different productions seems to be convenient. Examples for this are electronic printed circuitries which are produced in different variables. Advantages are, that investigations for the installation of several working areas are eliminated and considerable costs for stocking of invested capital can also be eliminated as working places can be filled twice.

An especially preferred embodiment may be prepared wherein a socket pin with at least one light entry opening and one or more light exit openings is designed for the light projection holes in the base plate and the adapter plate, and that the light exit opening for the reception of the glass fiber optics is developed as light guide.

This embodiment has the advantage that an axis-exact light projection is possible on the focal point, so that no spill light appears. Beyond, through such a socket pin, which can also be combined several ways with similar socket pins, a big number of signals can be transmitted so that, for example, with only one exit signal (calculating one socket pin with 6 exits, so that this one can again be combined with 6 of such pins) 36 exit signals can be produced. The advantage is, that very complicated assembly sequences can be clearly stipulated and that, beyond, the light signals can be applied to indicated assembly steps instead of mechanical numbering systems. The big number of signals available enlarges considerably the application area of the apparatus, as pointed out in detail below referring to FIG. 8.

With a special execution form, the socket pin is provided with a snap coupling for the light projection. Through this, the assembly of such pins will be considerably facilitated.

With an advantageous modification according to the invention, the light entry opening of the socket pin is developed with a fit for a disc transparent to light, which preferentially consists of a plastic material. By this means, a further improvement of the light projection can be obtained.

An especially preferential execution form according to the invention is given, if the light exit openings for the glass fiber optics are ordered co-axial around the central light exit opening.

For the daily practice, the following specific advantages result from the above basically described invention:

(1) Job enlargement or job enrichment can be well practiced, even with untrained personnel with a limited memory.

(2) Deflects in quality because of incorrect assembly sequence (especially in the electronics industry) will be minimized. This results in a decrease of spoilage costs.

(3) In case of repetition production, drawings as working papers are not necessary.

(4) The MTM standard time values "ET" (eye travel) and "EF" (eye focus) can be definitely eliminated from the standard data system with this kind of assembly. Through this, for instance, a reduction of 0,05 DM per smallest assembly operation can be achieved.

(5) Controversies between employee and employer are eliminated with regard to points for "additional mental work" in the value of worker productivity for the analytic rating which has a strong influence to the job classification.

(6) Each plant manager in practice has no longer to settle the problem of looking for appropriate personnel in case of absence or change. The faster working instruction diminishes, at the same time, considerable manufacturing losses.

(7) Training costs for new personnel decrease considerably.

(8) The internal paper work in the factory can be minimized and the related costs can be reduced.

(9) A time reduction in all assembly sequences can be achieved and, at the same time, a decrease of production costs in the standardization area.

Further advantages and details and especially essential characteristics of the invention, which for intensifying of the protection demand have not been pointed out in sub-claims, are shown in the following description in which the invention is explained in detail according to the drawn up forms of execution. It shows:

FIG. 1 A schematic top view of a first embodiment of the apparatus according to the invention.

Figure 2:
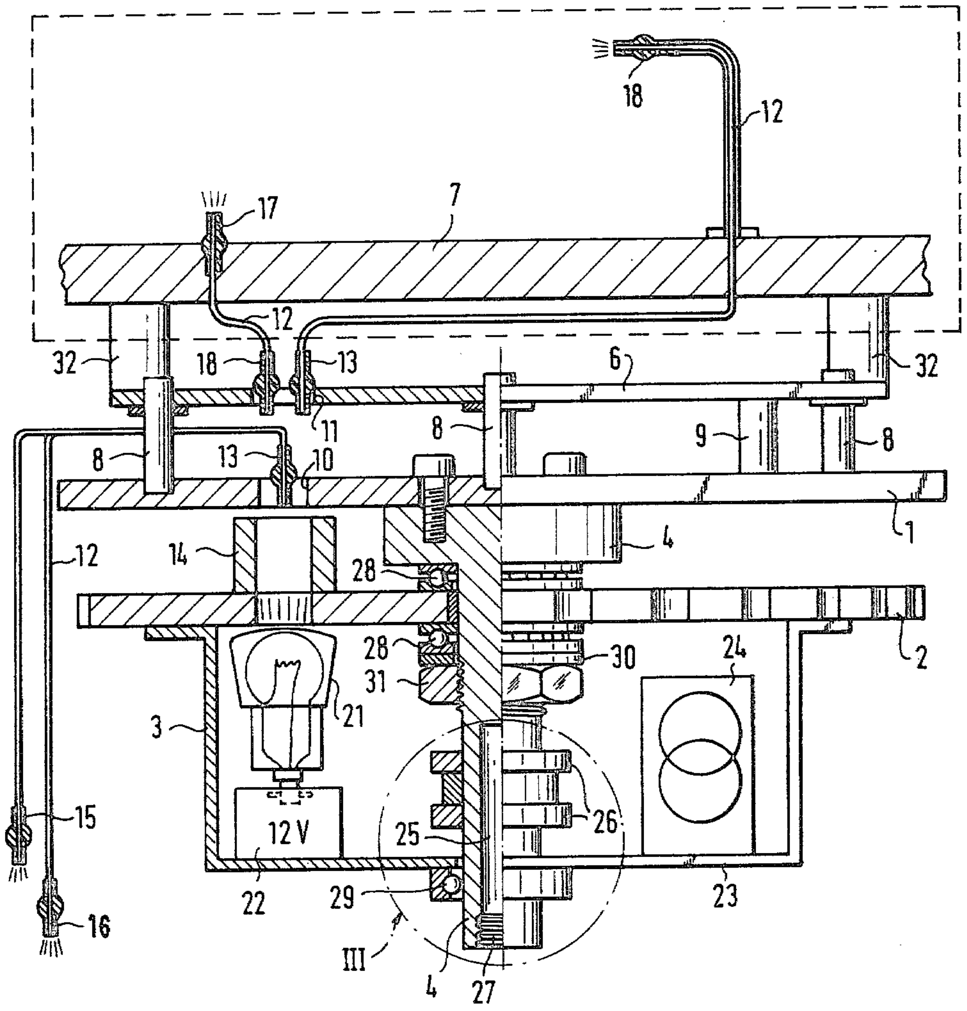

FIG. 2 A sectional view along of the line II—II in FIG. 1.

Figure 3:
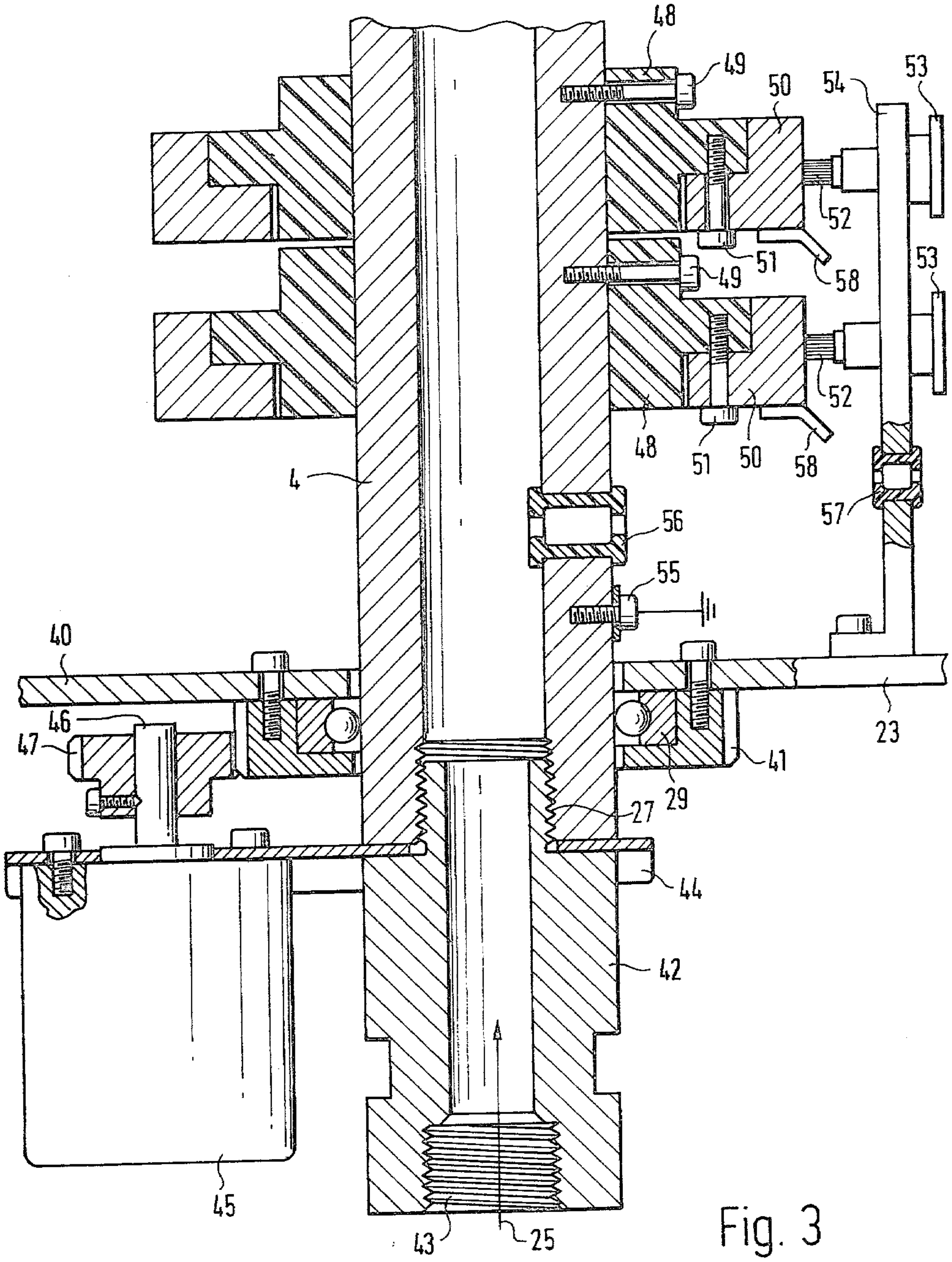

FIG. 3 The detail III of FIG. 2 in an increased measure.

Figure 4:
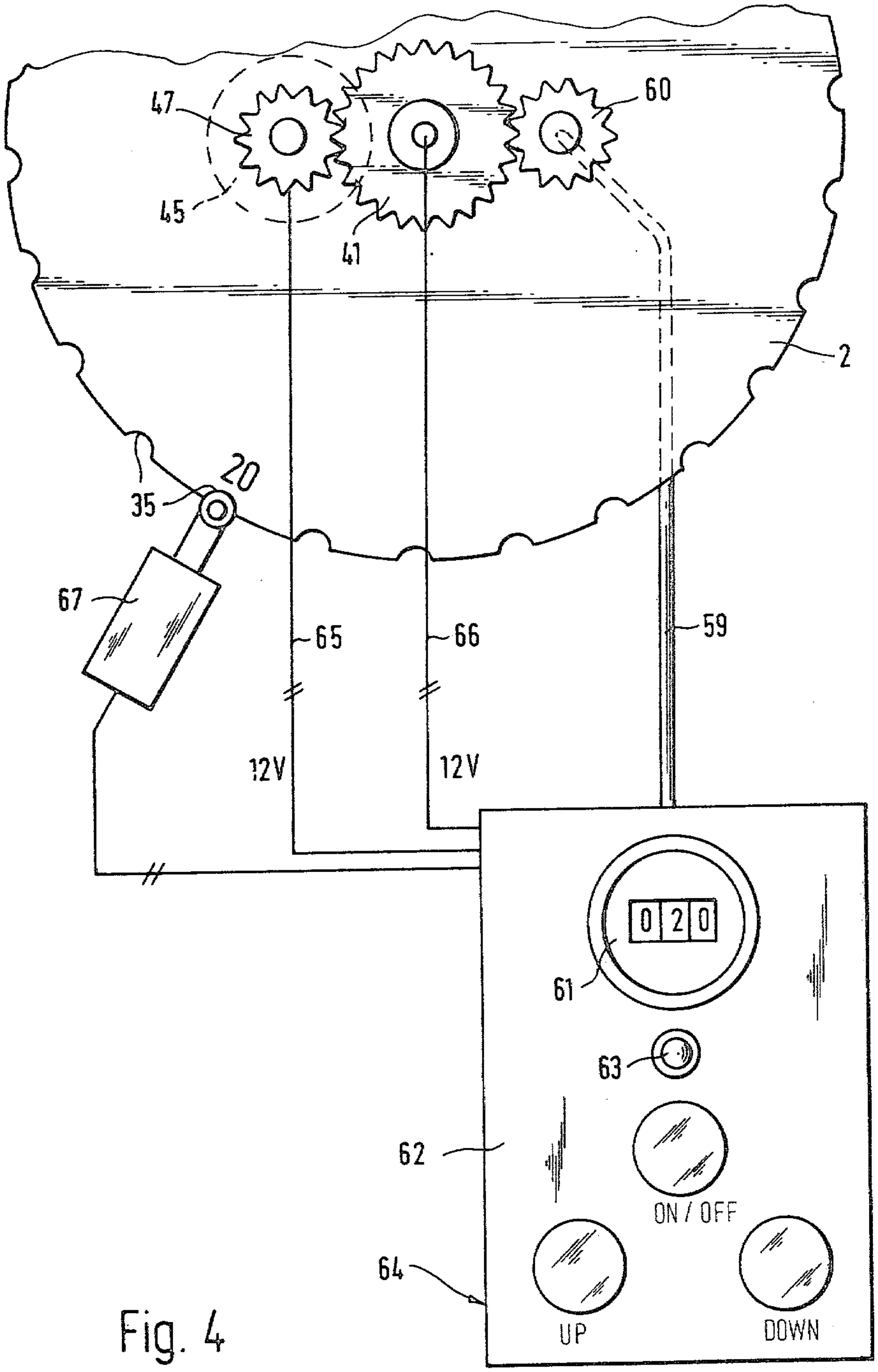

FIG. 4 A schematic view of a second embodiment according to the invention.

Figure 5:
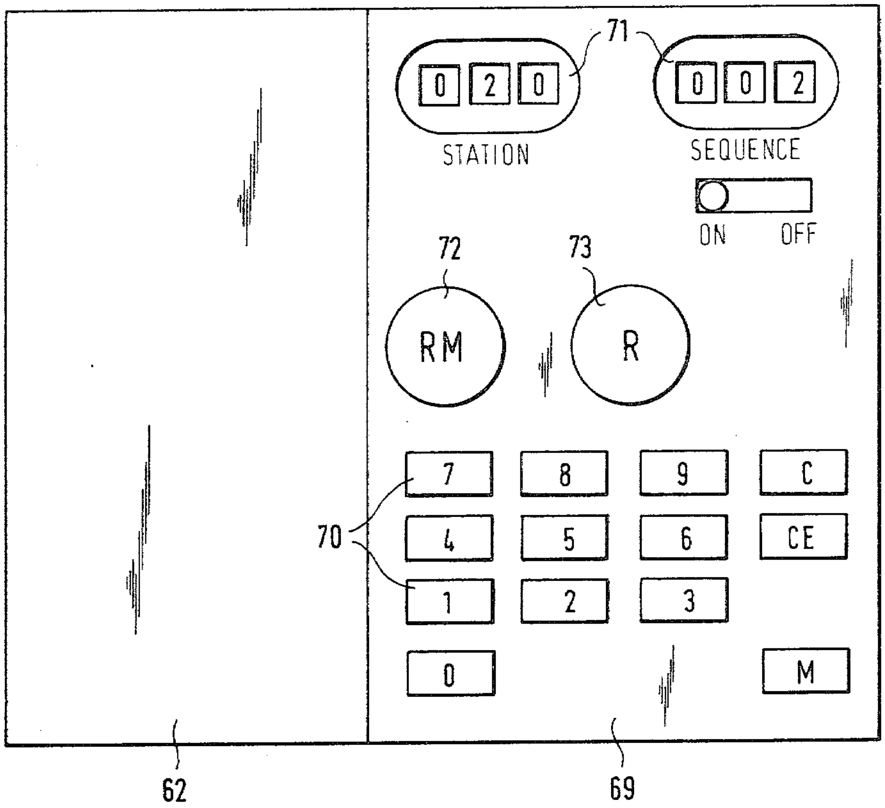

FIG. 5 A detail of a third embodiment in a schematic drawing and

Figure 6:
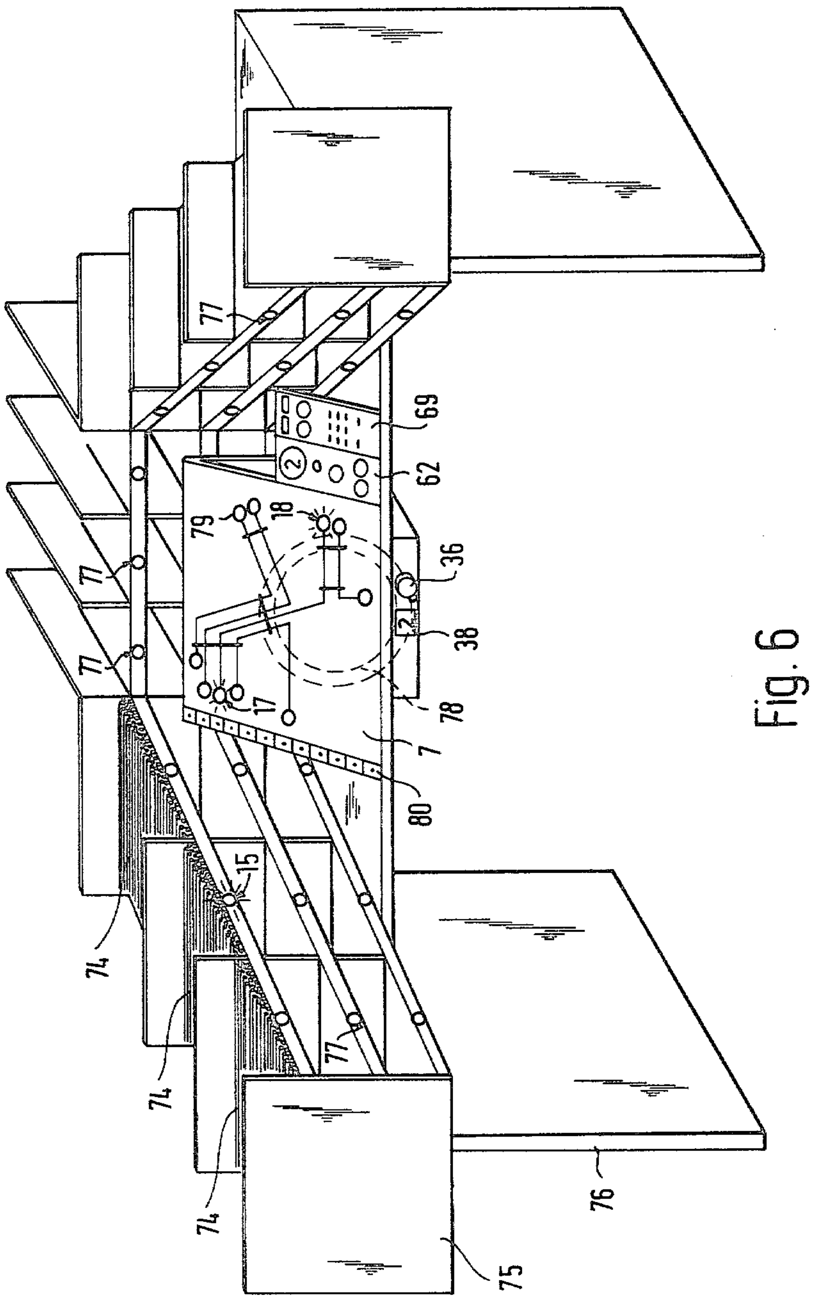
Figure 7:
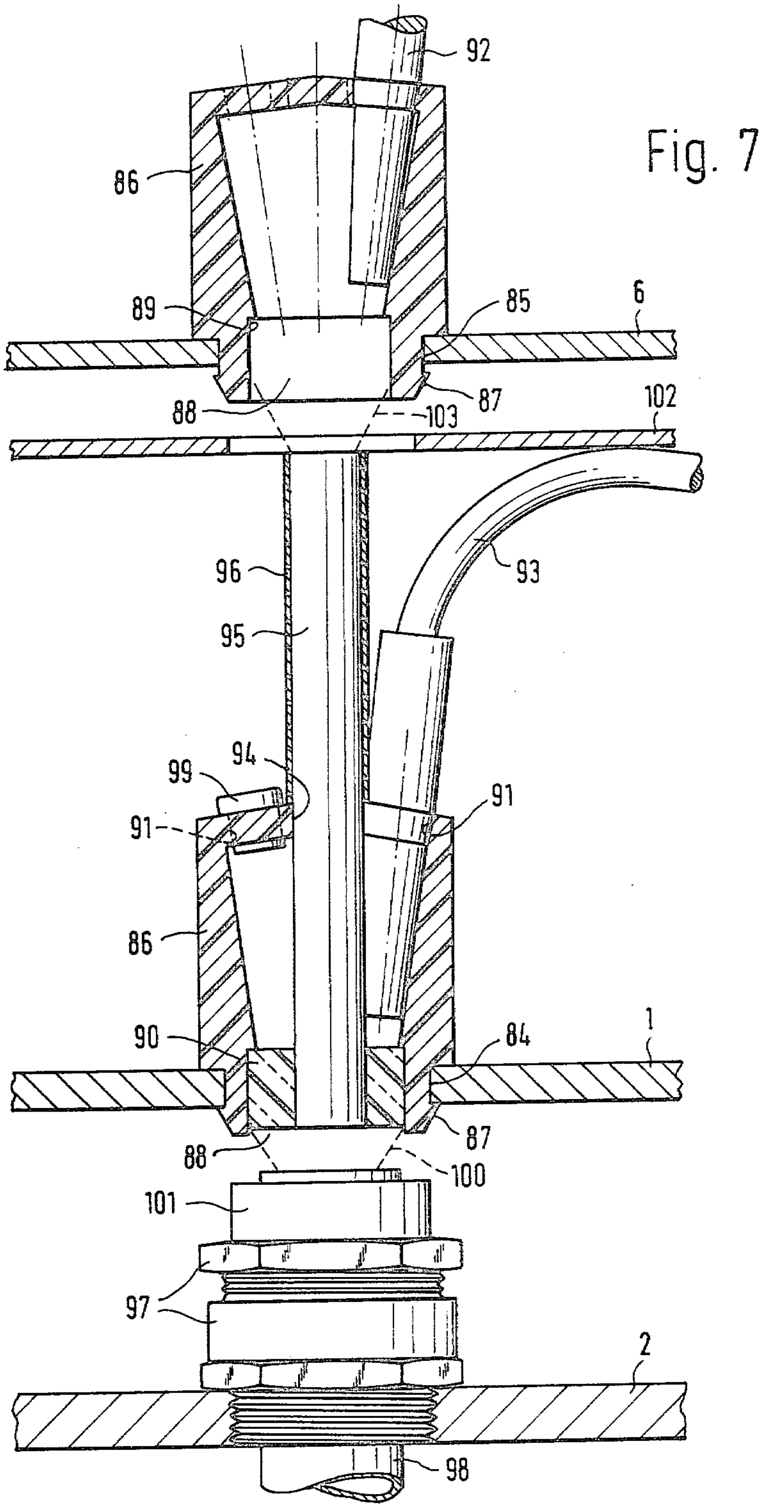
Figure 8A:
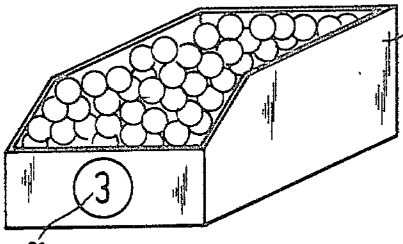
Figure 8B:
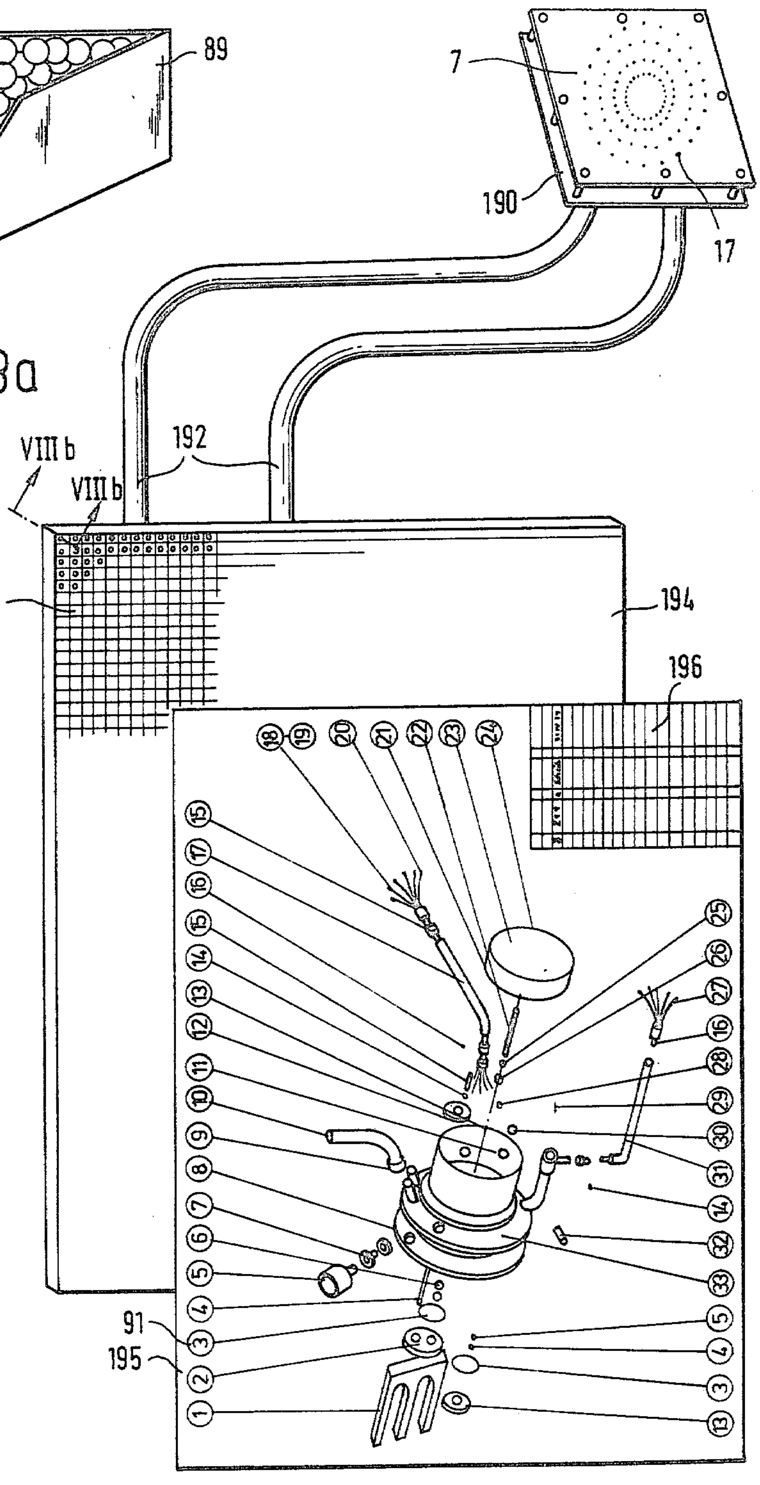
Figure 8B:
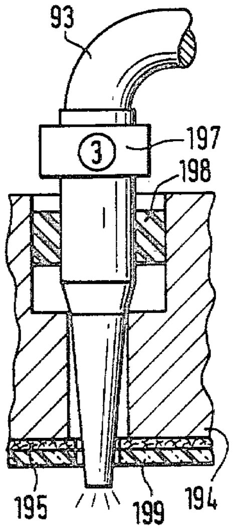

FIG. 6 A schematic total view of an assembly place built according to the invention;

FIG. 7 An enlarged lateral sectional view of the socket pins according to the invention and their assembly areas, and FIG. 8 (consisting of FIGS. 8A and 8B) schematic view of an application example, as it is given through the big number of applicable light signals.

The form of execution of the invention shown in FIGS. 1 and 2 consists in its core piece of a base plate (1) with a screen disk (2) on which a light unit (3) is fixed and centered. The base plate (1), the screen disk (2) and the light unit (3) are connected through the axis (4).

The base plate (1) is fixed with the axis whereas the screen disk (2) together with the light unit (3) as total unit is located moveable around the axis (4). With the example given, the screen disk (2) shows a graduated arc division of 26 positions as stated by the figures (5) on the border of the screen disk, and can be so indexed in 26 ways. In this position it should be pointed out that this division can, by all means, be extended or reduced. Above of the base plate (1) the reception of an adapter plate (6) is shown which presents the connection to an especially developed assembly apparatus which in FIG. 2, for instance, is marked with (7). The assembly apparatus can be chosen in any shape and size. The adapter plate (6) is centered over three center pins (8) with four space holders (9) on the base plate.

The base plate (1) as well as the adapter plate (6) shows according to the screen disk (2) borings (10 or 11) in the same graduated arc division. These borings (10 or 11) serve for the receipt of glass fiber optics (generally marked with 12) which are taken up in end caps (13). In the example shown, each boring (10 or 11) in the adapter plate (6) as well as in the base plate (1) serves for the receipt of two each end caps (13) which are shifted 90°. This kind of arrangement is especially advantageous as no shadows appear. Additionally, on the screen disk (2) a light tube (14) is fixed which directs a bundled cone of light through the coincident borings (10 and 11) of the adapter plate (6) and base plate (1). The glass fiber optics (12) which are fixed on the base plate (1) lead to the material supply positions (15, 16) whereby, as the example shows, two of these positions can be designed for simultaneous work.

The glass fiber optics (12) which are fixed on the adapter plate (6) lead to assembly position places (17, 18) on the individually developed assembly apparatus (7).

The bundle connections (19, 20) for the glass fiber optics (12) on the base plate (1) are provided for passing the glass fiber optics (12) into flexible tubes which direct to the material supply- or assembly positions and which there will again be separated in single bundles. For completeness, it has to be mentioned that all moveable connections are preferentially made up with imbus-screws and all fixed connections are either sticked to with a special adhesive glue or hard soldered.

The light unit (generally marked with 3) takes up as in FIGS. 1 and 2 examples shown, a halogen lamp (21) driven with 12-V co-current flow which is placed in a socket (22). The socket (22) contains coincidently the necessary safety devices. Furthermore, the usual terminal strips and wires are assembled in the light unit (3) which altogether are placed in a portable container (23). With the example shown in FIGS. 1 and 2, the portable container (23) additionally provides a transformer of 220 to 12 V, whereby the current will be supplied inside of the axis (4) through a current supply channel (25) by means of a conduction (not drawn up). The current supply cable will be connected to ring wheels (26) whereby in view of details of the current supply FIG. 3 is referred to, which, however, shows an execution with electromotive gear. In order to pick up the increasing power from the current supply cable, a PG-screwing (27) is designed on the bottom of the axis (4).

As is evident in FIG. 2, the unit consisting of the screen disk (2) and the light unit (3) is movably arranged opposite to the unit consisting of the base plate (1), adapter plate (6) and assembly device (7). The screen disk (2) is mounted on bearings (28) on the axis (4) and a further bearing (29) at the bottom of the portable container (23). The bearing (28) at the bottom of the screen disk (2) is fixed by a washer (30) and a nut (31) screwed on the axis (4).

Furthermore, distance spacing bushings (32) between assembly apparatus (7) and adapter plate (6) provide the space required for an appropriate conduction of the glass fiber optics (13) between these elements (FIG. 2).

Especially shown in FIG. 1 is the mechanical manual control of the apparatus. The base plate (1) carries the mechanism wherein a screen stopping device is located on a holding angle (34). The screen stop (33) snaps in the ratchets designed on the outside of the screen plate (2). For indexing of the screen plate (2) a control button (36) is provided carried through the base plate (1), by means of which the screen plate can be further indexed. A position indicator 38 shows the momentary position of the screen plate (2).

The total manual gear can be screwed up by a moveable screwing connection with the base plate (1) for which fastening holes (39) are available.

The detail III from FIG. 2 according to the drawing in FIG. 3 shows beside the constructive characteristic of current supply to the halogen lamp (21) also the constructive details for an electromotive gear according to a second embodiment of the invention.

For indexing of the screen disk inclusive light source through electromotive drive, a gear ring (41) is designed with the embodiment according to FIG. 3, combined with the bottom (40) of the portable container (23). The gear ring (41) is either fixed through the exterior bushing of the bearing (29) with the bottom (40) or is directly screwed onto the bottom (40) of the portable container (23) and takes up the bearing (29) inside. In each case, the gear ring (41) together with the portable container (23) and the screen disk (2) opposite to the axis (4) are moveable.

In the screw thread (27) for the PG-screwing with the embodiment according to FIG. 1, an adapter piece (42) is screwed in which equally shows on its bottom a screw thread (43) for PG-screwing for the cable supply (25). On its upper end the adapter piece (42) carries a plate (44) for holding the motor (45) placed outside of the axis (4). The motor (45) is a direct current driven motor with an electric potential of 12 V, so that the halogen lamp (21) and the motor (45) are fed through the same transformer which is outside of the portable container (23) in the gear section. The motor (45) carries on the top of its shaft (46) a pinion (47) which gears into the gear rim (41) and in this way can move the light unit and screen disk. It is obvious, that with the most simple means, it is possible to reset the unit according to FIGS. 1 and 2 in the motor-driven unit according to FIG. 3, as the total motor-driven gear is carried by the adapter piece (42) and only the gear rim (41) on the bottom of the portable container has to be fastened through screwing.

The details of the current supply for both units consist mainly of insulating rings (48) which are fastened by means of screws (49) on the axis (4) and ring wheels (50) fastened on the axis which are fixed through screws (51) on the insulating rings. On the ring wheels (50), carbons (52) or carbon brushes are in gliding contact which are held in the usual carbon supports (53). The carbon supports (53) are disposed in a holding plate (54) for the collector brushes which secures the right distance and pressure to the ring wheels. An earthing screw (55) is disposed on the axis (4). For the current supply of the light source, the current supply cable is directed upwards through the adapter piece (42) into the axis (4) through a cable duct (56) out of the axis (4) and connected to the plugs (58) on the ring wheels which consist of AMP terminals. A further cable supply (57) is designed in the holding plate (54).

In FIG. 4 there are shown details of the gear for the unit according to FIG. 3 in a schematic drawing in top view. The motor-driven gear for this embodiment requires a distance control which can be disposed appropriately. The gear pinion (47) of the motor (45), which is adapted to the gear transmission, actuates the rotation by means of a mechanical shaft (59) produced by a further gear wheel (60) to a mechanical numerator (61) or speedometer which indicates the position accordingly. With the example shown in FIG. 4, position 20 is in operation which corresponds to the screen (35) on the outer circumference of the screen disk (2).

The mechanical counter is located in a gear box (62) which beside control lamp (63) contains the usual control buttons. In the gear box (62) a transformer (24) (not shown on the drawing) is located, so that the current supply (64) provides the usual alternating current. From the gear box (62) the 12-V transmission (65) leads to the gear, whereas the 12-V transmission (66) leads to the light unit. A mechanical working generator (67) provides the transmission of the electric impulses from gear box (62) and corresponds to the stop (33) of the subject in FIG. 1, wherein the screen disk (2) is interlocked in the right position. From FIG. 4 it can be seen that the motor-driven gear preferentially shows two directions of rotation so that, for instance, the up-button can be operated for a right-handed rotation and the down-button for a left-handed rotation of the screen disk (2) and that the positions desired can be moved to in the shortest way.

A further and especially preferential arrangement according to the invention is shown in FIG. 5 which contains the electronic control. The electronic control can be provided by an insignificantly modified minicomputer, which for to save expenses is given preference. The electronic part is combined as indicated in FIG. 5, with the means of an adapter plug (not shown on the drawing) with the gear box (62) or remote control board. With this embodiment a programming of irregular position sequences is possible. For the programming of assembly sequences, the electronic control (69) shows a digital keyboard (70). Furthermore, two digital indicators (71) are designed which indicates what station is in operation and what assembly sequence is running.

A main switch (on-off) renders the possibility to switch over to the electro mechanical control according to FIG. 4. The button M is designed for storage and the C or CE buttons are for cancellation of the total or single sequences. The RM button (72) offers the possibility to stepwise call up the stored assembly programme and the R button (73) permits the input of individual corrections. In the same way it is possible to use a free programable electronic part on which the assembly sequences are stored in an optimal way and which can be operated by calling-up of the positions required of the screen plate (2).

In FIG. 6 an embodiment and application example is shown according to the invention, in the three already indicated alternatives. A working place for series production of the laying, examining and bundling of wire harnesses is illustrated. Such wire harnesses are laid, examined and bundled in a necessary forcibly actuated sequence which seems to be convenient on the side of biotechnology. The prefabricated single cables (74) with end connections are contained in boxes, sorted and in an appropriate stock which are part of the work bench (76). Each of these boxes is fitted with light signals or exits (77) which are built either through the built-in ends of the glass fiber optics or through additional lenses or the like. The assembly place shown, furthermore contains the apparatus generally marked with (78), which either can be fitted with hand drive (36), motor drive (62) or electronic control (69).

In the individually developed assembly plate (7), which in the above case is equipped as a wire harness laying device, the ends of the glass fiber optics (12) are installed in such a manner that the optic signals are transmitted to the surface of the assembly plate. By the example shown, the prefabricated single cables (74) are filed by assembly sequences by hand-drive in the sockets (75) through the means of the positions of the parts list. Now the single cables have to be combined to wire harnesses according to convenient methods of biotechnology. According to the positions of the parts list, it can be laid only by advance with the mechanical manual indexing device although on the side of biotechnology perhaps another sequence could be more convenient. As the example shows, the indexing advance is switched to position "2" as visible on position indicator (38). Hereby exit (15) lights up in the material supply position corresponding to "2". At the same time, exists (17) and (18) light up in the assembly plate which show beginning and end of the cable taken out from position "2", as the points of contact, when it is assembled to the wire harness. Then the cable is taken out of the box (2) and is laid down according to the lighting-up signal between (17) and (18). So, the laying of all cables which have to be adapted is executed, position by position, as it is commanded by the entries of the glass fiber optics of the adapter plate. If no light signal of a position occurs, it has to be switched forward accordingly to the next position.

After laying of all cables marked by the indexing advance, this invention offers the additional advantage of immediate control of the electric passage on the assembly area. For this, as with the example shown, a testing board (80) is developed. If contacting errors occur, error marks are put on the testing board, whereby the testing board (80) is marked according to the positions of apparatus (78). After complete testing, the error sequence will be known. For error finding, only electric wiring is assembled (devices not shown on the drawing) by which lighting up of the positions concerned, an examination for electric passage is given. In order to locate the error, screen by screen has to be operated by the mechanical control until the indication requested is shown on the scale, whereby simultaneously the corresponding exits (79) light up. Consequently, at this moment of the production, a substitute can be taken out of the simultaneously lit-up material supply and the defective cable can be replaced. After replacement, the bundling of the wire harness is possible which after quality control is performed.

With the electro mechanical operation of the apparatus (78), as above described, the serial assembly sequence is likewise necessary, according to device and position, subject to the parts list. The error finding will be quicker through the mechanical indication on the speedometer as all of the screen positions are operable while under constant pressure.

On application of the electronic control (69) an operation sequence can be programmed, subject to biotechnological methods which assigns according to the programme, and station by station, out of which faster assembly sequences can be achieved. After quality control and fault localization, the position desired can be run per the interactive mode through reading in of single blocks. The assembly operation is, in this way, faster, more rational and correct and the remaining operation for the finishing of the complete wire harness is according to the above described operation sequence.

FIG. 7 shows in a lateral enlarged sectional view a cutout of the apparatus, from which it can be seen that a base plate (1) and an adapter plate (6) have congruent bores (84, 85), balanced with a screen disc (2). The bores (84 and 85) are designed as light projection holes in the adapter plate (6) or the base plate (1). In the bores (84, 85), socket pins (86) are installed which preferentially consist of plastic material and which show on their bottom end a snap coupling (87) locking in the openings (84, 85).

Each socket pin (86) has on its bottom end a light entry opening (88) which serves for the reception of the light rays produced by the light signals. For better light guidance and clearer focussing, the light entry opening (88) is developed with a cylindrical recess (89) which can retain a transparent disc (90), preferably a plastic disc. At the top end of each light pin (86) a number of light exit openings (91) are positioned for the reception of the coupling parts (92) on the glass fiber optic bars, which serve as light guide. In the embodiment show, on each socket pin (86) in the base plate (1), a central light exit opening (94) is provided, in which, for instance, a light guide bar (95) can be positioned. By means of these light guide bars, a number of pins (86) can be vertically coupled together, so that through a single output signal a big number of signals can be produced.

In order to avoid spill light, the light guide bar (95) is covered with a light-tight, especially black safety tube.

With the embodiment shown, each boring (84) in the base plate (1) and each boring (85) in the adapter plate (6) takes up one of the socket pins (86), which are ajusted congruently. Through this, an axial light transmission in the focus point is possible. On the screen disc (2), furthermore a PG-screwing (97) is fastened which serves for the reception and centering of a central light guide (98) which comes out of a halogen lamp (not shown).

For not required light outputs, blind caps (99) are designed in the socket pins (86) so that here again no spill light can emerge. The glass fiber optic rods (93) serving as light guides and fastened on a socket pin in the base plate (1), lead to the material supply positions whereby, for example, for a simultaneous working, two areas for material supply are marked by light signals. A socket pin (86), as shown, can additionally take up up to 5 glass fiber optic rods (93).

For free of diffused light and non-dissipative transmission of the light beams (100) which emerge from the centre bushing (101) of the PG-screwing (89), a plastic disc transparent to light (90) is assembled in the recess (89) which similarly serves for the holding of the light guide bar (95) which, as already mentioned above, supports a black safety tube (96) inserted in the base plate above the socket pin (86). Through this light guide bar, an axial focussing transmission of the light signals is possible, so that on the surface of the adapter plate (102), the light beams (103) are transmitted exactly in the opening for the light entry (88) of the socket pin (86) inserted in the adapter plate (6).

The big number of applicable signals with minimum light loss renders the possibility to use the above-mentioned apparatus more universally.

As an example, the embodiment according to FIG. 8, which is designed as a universal training apparatus with a universal adapter unit, is described more fully below.

This universal apparatus mainly consists of a complete adapter part (190) which serves for the reception of all light guides (93). The light guides (93) are positioned in socket pins (86), which are pressed in bores (87). Through flexible safety tubes (192), the light guides are transmitted and bundled to the back of a programmable plate (194) which, for example, can exist of wooden material. Each light guide (93) has on its end a unique position number (197) which on the embodiment shown is marked as number 3 and which is stipulated analogous to the central equipment. The plate (194) is divided into grid squares (193) and shows in the center of each grid square (193) a boring with steps.

The first step serves for the reception of a rubber washer (198) which conducts and supports one of the light guides (93). On the front side of the plate (194), a transparent disc, preferably of plastic material, is secured, which in the center of each grid square (193) has a boring. This disc serves for the covering of individual and exchangeable explosion sketches (195) of the various units or assembly units which have to be mounted. Each explosion drawing (195) contains a programme information (196) with the light guide positions (197) and the respective grid squares. In the respective grid square, the sketch shows a breaking-through, whereby the signal appearing at the end of a light guide, marks the appropriate single part of the assembly unit. The sequential light signalling of the central device guarantees, (above the adapter piece (190), which will be fastened on this) that the assembly sequence necessary is indicated. Parallel to the position number, for instance 3, a planned storage bin (189) has the same position number (191), namely for instance 3, whereby the parts assortment required is stored in these bins.

An apparatus of this kind can be used in many ways. For example, it can be applied as a fixed installation, when complex assembly units have to be produced, whereby parallel signalling on the storage bins will be applied. This kind of application, nevertheless, is only serviceable if a constant installation seems to be useful and thus quality defects are to be avoided. Furthermore, such an apparatus can be used as training unit when new personnel have to be made acquainted with the manufacture of the various assembly units. With a simultaneous programme change of the signalling and through change-out of the above mentioned explosion drawings, the most different training programmes can be executed. A similar application would be possible as a programmed working instruction machine, for instance, with the introduction of new products. The experience has shown that with the application of this apparatus the learning curve of the operating personnel flatens out faster. A further variant application possibility of the apparatus according to the invention would be a kind of foreman's replacement if in case of personnel outage temporary personnel has to be trained and no appropriate instructor is available.

With the above described application possibility it is obvious, that through usage of the apparatus according to the invention, considerable saving of expenses, especially in the personnel area, can be achieved. These are, for example, start-up costs with new products and training costs for new personnel, as the information will be taken over by the apparatus after short instruction through the foreman.

From the above description it can be seen that the invention is not restricted to the examples shown on the drawings, but offers to the expert many modification possibilities out of the basic idea of the invention, which means the preset of assembly sequences or single part supply sequences through optic signals. So, for example, the optic signals can also be produced by the application of micro processors or similar technics, directly by electronic means which will be a good and cost reducing possibility. A further possibility to produce optic signals would be the usage of a film coded with the appropriate light points which in a single frame mechanism could be switched forward from assembly position to assembly position by means of a light source, whereby the forwarding of these signals could likewise be transmitted through the above described glass fiber optics or -bundles.

All of the technical details stated in the description and visible from the drawings are of importance for the invention.

What is claimed is:

1. Apparatus for sequentially assembling parts in a specified order of steps into a desired device, the parts being located in a plurality of material supply positions, the apparatus comprising:

a fixed base plate having a plurality of openings transparent to light therein;

a plurality of assembly positions;

an adapter plate positioned parallel to said base plate having a plurality of openings therein congruent with said openings in said base plate;

light means movably attached to said base plate for selectively shining through said openings in said base plate and said adapter plate;

glass fiber optic means for transmitting light from said light means to said assembly positions and the material supply positions, said glass fiber optic means including a plurality of fittings secured in said openings in said base plate and said adapter plate and glass fiber optic conduit means extending between selected fittings and said assembly positions and the material supply positions; and means for sequentially moving said light means from opening to opening;

whereby the specified order of steps of assembly at said assembly positions and appropriate material supply positions to each step are successively indicated by said light means being sequentially moved past said openings shining light therethrough and further through the thereby selected portions of said glass fiber optic means to said assembly positions and the material supply positions.

2. Apparatus according to claim 1 wherein said fittings are secured in the openings of the adapter plate in ordered endcaps.

3. Apparatus according to claim 1, said light means is adapted to rotate and said openings of the base plate are arranged in a circular pattern coaxial to the rotation of said light means.

4. Apparatus according to claim 1 wherein said means for sequentially moving said light means can be driven by hand.

5. Apparatus according to claim 1 wherein said means for sequentially moving said light means is motor driven.

6. An apparatus according to claim 3 further comprising a shaft coaxial to said circular pattern and attached to said base plate and wherein said light means comprises a container rotatably secured to said shaft, a light source in said container, a screen disk covering said container having a single opening for said light source to shine through, and an interlock means for positioning said single opening selectively at said openings in said base plate and said adapter plate.

7. Apparatus according to claim 6 wherein said interlock means is impulse operated.

8. Apparatus according to claim 1, each of said fittings comprises a socket pin having at least one light entry opening and one or more light exit openings, and said light openings are adapted for support of the glass fiber optic conduit means.

9. Apparatus according to claim 8 wherein each said socket pin has a snap socket connection for said openings.

10. Apparatus according to claim 8 or 9 wherein each said socket pin in said base plate has a central light exit opening for the installation of a light guide bar.

11. Apparatus according to claim 10 wherein each said light guide bar above the socket pin is fitted with a light-tight safety tube.

12. Apparatus according to claim 8 wherein each said light entry opening is fitted with a socket for the installation of a disc transparent to light.

13. Apparatus according to claim 10 wherein said light exit openings are ordered co-axial to the central light exit opening.

14. Apparatus according to claim 1 wherein said plurality of assembly positions are on an assembly apparatus interconnected with said adapter plate, said assembly apparatus having bores at predetermined positions receiving selected glass fiber optic conduit means in a predetermined array, whereby the specified order to steps of assembly at said assembly positions are successively indicated.

* * * * *